(12) United States Patent
Tan et al.

(10) Patent No.: US 12,453,157 B2
(45) Date of Patent: Oct. 21, 2025

(54) MOS DEVICE WITH RESISTIVE FIELD PLATE FOR REALIZING CONDUCTANCE MODULATION FIELD EFFECT AND PREPARATION METHOD THEREOF

(71) Applicant: NO.24 RESEARCH INSTITUTE OF CHINA ELECTRONICS TECHNOLOGY GROUP CORPORATION, Chongqing (CN)

(72) Inventors: Kaizhou Tan, Chongqing (CN); Tian Xiao, Chongqing (CN); Jiahao Zhang, Chongqing (CN); Yonghui Yang, Chongqing (CN); Xiaoquan Li, Chongqing (CN); Pengfei Wang, Chongqing (CN); Ying Pei, Chongqing (CN); Guangbo Li, Chongqing (CN); Hequan Jiang, Chongqing (CN); Peijian Zhang, Chongqing (CN); Sheng Qiu, Chongqing (CN); Liang Chen, Chongqing (CN); Wei Cui, Chongqing (CN)

(73) Assignee: NO.24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 27 days.

(21) Appl. No.: 17/925,322

(22) PCT Filed: Apr. 26, 2021

(86) PCT No.: PCT/CN2021/089923
§ 371 (c)(1),
(2) Date: Nov. 15, 2022

(87) PCT Pub. No.: WO2022/095347
PCT Pub. Date: May 12, 2022

(65) Prior Publication Data
US 2024/0038853 A1    Feb. 1, 2024

(30) Foreign Application Priority Data
Nov. 6, 2020    (CN) .......................... 202011232183.1

(51) Int. Cl.
*H10D 64/00*    (2025.01)
*H10D 30/01*    (2025.01)
(Continued)

(52) U.S. Cl.
CPC ....... *H10D 64/115* (2025.01); *H10D 30/0297* (2025.01); *H10D 30/665* (2025.01);
(Continued)

(58) Field of Classification Search
CPC . H01L 29/405; H01L 29/407; H01L 29/7813; H01L 29/0619–0623;
(Continued)

(56) References Cited
U.S. PATENT DOCUMENTS

2010/0320535 A1\* 12/2010 Schmidt ............... H10D 64/118
257/341
2013/0037880 A1    2/2013 Liu et al.
(Continued)

FOREIGN PATENT DOCUMENTS
CN    104051540 A    9/2014
CN    104576730 A    4/2015
(Continued)

*Primary Examiner* — Samuel A Gebremariam
*Assistant Examiner* — Jonas T Beardsley
(74) *Attorney, Agent, or Firm* — IPRTOP LLC (57) ABSTRACT

The MOS device with resistive field plate for realizing conductance modulation field effect in the present invention is based on the existing trench gate MOS device, and a semi-insulating resistive field plate electrically connected to the trench gate structure and the drain structure is added in the drift region, where the trench gate structure can control the on-off of the MOS channel, and the semi-insulating
(Continued)

resistive field plate can adjust the doping concentration of the drift region to modulate the conductance of the on-state drift region and the distribution of off-state high-voltage blocking electric field, thus a lower on-resistance can be obtained. In addition, the modern 2.5-dimensional processing technology based on deep trench etching is adopted in the present invention, which is conducive to the miniaturization design and high density design of the structure and is more suitable for the More than Moore (beyond Moore) development of modern integrated semiconductor devices.

5 Claims, 9 Drawing Sheets

(51) Int. Cl.
*H10D 30/66* (2025.01)
*H10D 62/10* (2025.01)

(52) U.S. Cl.
CPC ......... *H10D 30/668* (2025.01); *H10D 62/102* (2025.01); *H10D 64/117* (2025.01)

(58) Field of Classification Search
CPC .... H01L 29/7803–7808; H01L 29/404; H10D 30/668; H10D 64/117; H10D 64/115
See application file for complete search history.

(56) References Cited

U.S. PATENT DOCUMENTS

2018/0033859 A1* 2/2018 Feil ................. H01L 21/283
2021/0242341 A1* 8/2021 Kobayashi ........... H10D 64/115

FOREIGN PATENT DOCUMENTS

| CN | 104701380 A | 6/2015 |
| CN | 112349785 A | 2/2021 |

* cited by examiner

MOS DEVICE WITH RESISTIVE FIELD PLATE FOR REALIZING CONDUCTANCE MODULATION FIELD EFFECT AND PREPARATION METHOD THEREOF

FIELD OF TECHNOLOGY

The present invention relates to a field of semiconductor devices and integrated circuits, particularly to a metal oxide semiconductor (MOS) device with resistive field plate for realizing conductance modulation field effect and preparation method thereof.

BACKGROUND

For semiconductor devices, especially high-voltage silicon power devices, the optimized designs of the breakdown voltage and on-resistance of the drift region used to withstand voltage interact on each other and are contradictory, therefore, it is typically difficult to obtain a high breakdown voltage and a low on-resistance at the same time. However, the situation that a minority carrier or unbalanced dual-carrier high-level injection modulation is applied to the drift region used to withstand voltage when the device is on is not included, for example, insulated gate bipolar transistor (IGBT), P-I-N diode (PIN), gate turn-off thyristor (GTO) and the like. Generally, in high-voltage semiconductor silicon devices above 300V, a part of the on-resistance is occupied by the high-voltage drift region of the device, and the occupation becomes more and more serious with an increase of the working voltage, due to the limitation of the most famous silicon theory for non-minority carrier modulation power devices that the breakdown voltage to the power of 2.5 is proportional to the on-resistance of the drift region.

To reduce the on-resistance of the drift region of non-minority carrier modulation power devices under high voltage conditions, some methods and new device cellular structures have been proposed in the past ten years to reduce the on-resistance of traditional device cellular structures under the condition of keeping the breakdown voltage unchanged, where the most famous is a device with an improved Super Junction structure based on a two-dimensional electric field principle and a charge balance principle of semiconductor PN junction RESURF.

There are three types of super junction structures or structures with super junction-like effects currently known: the first type is a structure based on the PN junction; the second type is based on the PN junction structure in the first type, where the P-type or N-type region is replaced by a dielectric material with a very high dielectric constant, and the dielectric material with the very high dielectric constant can include a thin layer of a dielectric material with a typical dielectric constant along the interface of the P-type or N-type region; the third type is also based on the PN junction structure in the first type, where the P-type or N-type region are replaced by a thin layer of a dielectric material with a typical dielectric constant and a semi-insulating material layer structure that are along the interface of the P-type or N-type region, and the thin layer of the dielectric material with the typical dielectric constant and the semi-insulating material layer structure act as a resistive field plate.

However, great research progress has not yet been made for the second type of structure with super junction-like effects, and there are no experimental results or specific implementation schemes for the dielectric material with the high dielectric constant and the semi-insulating material layer structure, therefore, how to obtain high-voltage silicon power devices, such as MOS devices, with high breakdown voltage and low on-resistance based on the existing super junction structure is an urgent problem to be solved.

SUMMARY

The present invention aims to provide a MOS device with resistive field plate for realizing conductance modulation field effect and preparation method thereof.

The present invention provides a MOS device with resistive field plate for realizing conductance modulation field effect, which includes:
  a substrate;
  an epitaxial layer, arranged on the substrate;
  a MOS source region, arranged in the epitaxial layer and at the top of the epitaxial layer;
  a MOS channel region, arranged in the epitaxial layer and under the MOS source region;
  a trench gate structure, arranged on the top of the epitaxial layer, vertically covering the MOS source region and the MOS channel region;
  a semi-insulating resistive field plate structure, arranged in the epitaxial layer and electrically connected with the substrate, and located under the trench gate structure and electrically connected with the trench gate structure;
  where a trench is formed in the epitaxial layer, and the trench vertically penetrates from the MOS source region, the MOS channel region, and the epitaxial layer to the substrate; and the semi-insulating resistive field plate structure and the trench gate structure are sequentially arranged in the trench along the bottom to the top direction of the trench;
  along the trench wall inward, the semi-insulating resistive field plate structure includes a field plate dielectric layer and a semi-insulating resistive field plate layer, the trench gate structure includes a gate dielectric layer, a first trench gate layer, and a second trench gate layer; where the second trench gate layer is electrically connected with the semi-insulating resistive field plate layer; and the semi-insulating resistive field plate layer is electrically connected with the substrate at the bottom of the trench.

In an embodiment, the MOS device with resistive field plate for realizing conductance modulation field effect further includes:
  a MOS channel contact region, arranged at the top part of the epitaxial layer, and connected with the MOS channel region.

Further, the MOS device with resistive field plate for realizing conductance modulation field effect further includes:
  a source electrode, arranged on the MOS channel contact region, and electrically connected with the MOS source regions on both sides of the MOS channel contact region;
  a drain electrode, arranged on the side of the substrate away from the epitaxial layer;
  a gate electrode, arranged on the trench gate structure and electrically connected with the trench gate structure.

The present invention also provides a method for preparing the MOS device with resistive field plate for realizing conductance modulation field effect, which includes:
  providing a substrate, and forming an epitaxial layer on the substrate;

forming a MOS channel region, a MOS source region, and a MOS channel contact region at the top of the epitaxial layer;

forming a trench, vertically penetrating from the MOS source region, the MOS channel region, and the epitaxial layer to the substrate;

forming a semi-insulating resistive field plate structure and a trench gate structure sequentially in the trench along the bottom to the top direction of the trench, where the semi-insulating resistive field plate structure is electrically connected with the trench gate structure, and an end of the semi-insulating resistive field plate structure away from the trench gate structure is electrically connected with the substrate;

forming a source electrode, a drain electrode, and a gate electrode;

where the step that forming the semi-insulating resistive field plate structure and the trench gate structure sequentially in the trench along the bottom to the top direction of the trench includes:

oxidating the bottom and side walls of the trench to form a field plate dielectric layer;

etching and removing the field plate dielectric layer at the bottom of the trench;

filling the trench to form the semi-insulating resistive field layer, where the top part of the trench is not completely filled, and the remaining top part of the trench which is not filled at least passes through the MOS channel region;

etching and removing the field plate dielectric layer at the remaining top part of the trench;

oxidating the side walls and bottom of the remaining top part of the trench to form a gate dielectric layer;

along the trench wall of the trench inward, forming a first trench gate layer and a second trench gate layer in the remaining top part of the trench sequentially, where the bottom of the second trench gate layer is electrically connected with the semi-insulating resistive field plate layer;

the semi-insulating resistive field plate layer and the remaining field plate dielectric layer constitute a semi-insulating resistive field plate structure, and the first trench gate layer, the second trench gate layer, and the gate dielectric layer constitute a trench gate structure.

Further, the step that forming the MOS channel region, the MOS source region, and the MOS channel contact region at the top part of the epitaxial layer includes:

forming the MOS channel region in the top part of the epitaxial layer by a first ion implantation and a first ion diffusion;

forming the MOS source region on the MOS channel region by a second ion implantation;

forming the MOS channel contact region connected with the MOS channel region by a third ion implantation.

Further, the step that forming the semi-insulating resistive field plate layer in the trench includes:

filling the trench with semi-insulating polysilicon material, etching and removing a part of the semi-insulating polysilicon material filled in the trench to expose the top part of the trench, where the exposed top part of the trench at least passes through the MOS channel region; and the exposed top part of the trench is the remaining part of the trench which is not filled.

Further, the step that along the trench wall of the trench inward, forming the first trench gate layer and the second trench gate layer in the remaining top part of the trench sequentially includes:

forming a first doped polysilicon material, where the first doped polysilicon material at least covers the bottom and side walls of the remaining top part of the trench;

etching and removing the first doped polysilicon material and gate dielectric layer at the bottom of the remaining top part of the trench T to expose the top of the semi-insulating resistive field plate layer;

forming a second doped polysilicon material on the first doped polysilicon material, where the second doped polysilicon material at least fills the remaining top part of the trench;

etching the second doped polysilicon material and the first doped polysilicon material to form the second trench gate layer and the first trench gate layer, respectively.

The MOS device with resistive field plate for realizing conductance modulation field effect and preparation method thereof in the present invention has the following advantages:

1) The MOS device with resistive field plate for realizing conductance modulation field effect in the present invention is based on the existing trench gate MOS device, and a semi-insulating resistive field plate electrically connected to the trench gate structure and the drain structure is added in the drift region, where the trench gate structure can control the on-off of the MOS channel, and the semi-insulating resistive field plate can adjust the doping concentration of the drift region to modulate the conductance of the on-state drift region and the distribution of off-state high-voltage blocking electric field, thus a lower on-resistance can be obtained.

2) The modern 2.5-dimensional processing technology based on deep trench etching is adopted in the present invention, which is conducive to the miniaturization design and high density design of the structure and is more suitable for the More than Moore (beyond Moore) development of modern integrated semiconductor devices.

REFERENCE NUMERALS

1—substrate,
2—epitaxial layer,
20, 20'—oxide layer,
21—MOS channel region,
22—MOS source region,
23—MOS channel contact region,
3—semi-insulating resistive field plate structure,
4—trench gate structure, 30—semi-insulating polysilicon material,
31—field plate dielectric layer,
32—semi-insulating resistive field plate layer,
401—first doped polysilicon material,
402—second doped polysilicon material,
41—gate dielectric layer,
42—first trench gate layer,
43—second trench gate layer,
50—isolation dielectric layer,
5—source electrode,
T—trench.

DETAILED DESCRIPTION

The inventor has found that for the existing super junction structure devices or super junction-like structure devices, the optimization of the breakdown voltage and the on-resistance of the device has fallen into a bottleneck due to their contradictory relationship, and it is becoming more and more difficult to further reduce the on-resistance under the condition of keeping the breakdown voltage unchanged.

Therefore, the present invention proposes a technical solution, i.e., a MOS device with resistive field plate for realizing conductance modulation field effect, where a semi-insulating resistive field plate electrically connected to a trench gate structure and a drain structure at the same time is added to a drift region based on a trench gate MOS device, through which the conductance of the on-state drift region and the distribution of the off-state high-voltage blocking electric field are modulated to achieve a lower on-resistance.

The embodiments of the present invention will be described below. Those skilled in the art can easily understand other advantages and effects of the present invention according to the contents disclosed by the specification. The present invention may also be implemented or applied through other different specific implementation modes. Various modifications or changes may be made to all details in the specification based on different points of view and applications without departing from the spirit of the present invention.

Please refer to FIGS. 1-21. It needs to be stated that the drawings provided in the following embodiments are just used for schematically describing the basic concept of the present disclosure, thus only illustrating components related to the present invention, and are not drawn according to the numbers, shapes, and sizes of components during actual implementation, the configuration, number and scale of each component during the actual implementation thereof may be freely changed, and the component layout configuration thereof may be more complicated. It should be understood that the structures, proportions, sizes, and the like, which are illustrated in the drawings of the present specification, are only used to clarify the contents disclosed in the specification for understanding and reading by those skilled, and are not intended to limit the implementation of the present invention, thus are not technically meaningful. Any modification of the structure, change of the proportional relationship, or adjustment of the size should still fall within the scope of the technical contents disclosed by the present invention without affecting the effects and achievable objectives of the present invention.

Figure 1:
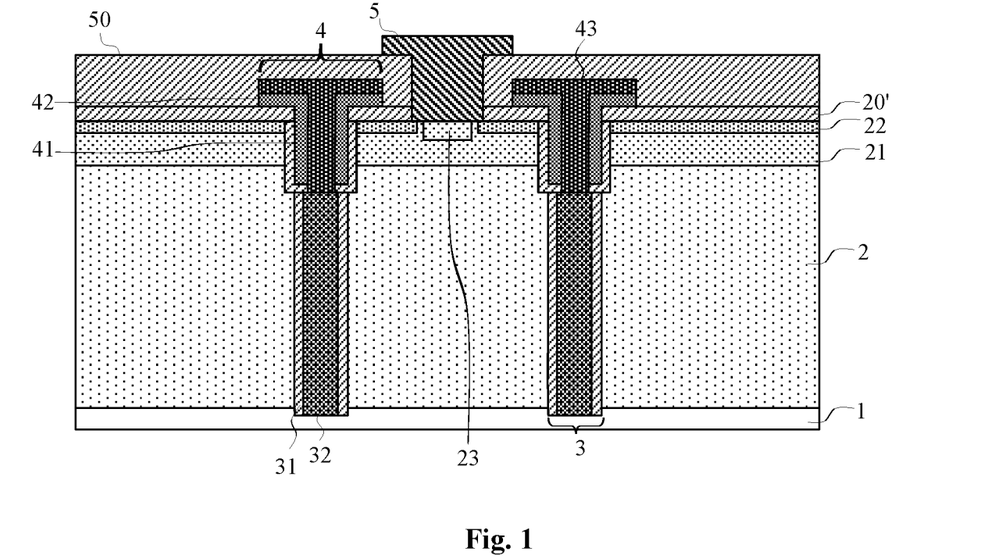
FIG. 1 shows a schematic diagram of a MOS device with resistive field plate for realizing conductance modulation field effect according to the present invention.

As shown in FIG. 1, the present invention provides a MOS device with resistive field plate for realizing conductance modulation field effect, which includes:
  a substrate 1;
  an epitaxial layer, arranged on the substrate 1;
  a MOS source region 22, arranged in the epitaxial layer 2 and at the top of the epitaxial layer 2;
  a MOS channel region 21, arranged in the epitaxial layer 2 and under the MOS source region 22;
  a trench gate structure 4, arranged on the top of the epitaxial layer 2, and vertically covering the MOS source region 22 and the MOS channel region 21;
  a semi-insulating resistive field plate structure 3, arranged in the epitaxial layer 2 and electrically connected with the substrate 1, and located under the trench gate structure 4 and electrically connected with the trench gate structure 4;
  where a trench is formed in the epitaxial layer 2, and the trench vertically penetrates from the MOS source region 22, the MOS channel region 21, and the epitaxial layer 2 to the substrate 1; and the semi-insulating resistive field plate structure 3 and the trench gate structure 4 are sequentially arranged in the trench along the bottom to the top direction of the trench. The "bottom" of the trench herein refers to the portion of the trench close to the substrate 1, and the "top" of the trench herein refers to the portion of the trench away from the substrate 1.

Specifically, as shown in FIG. 1, along the trench wall inward, the semi-insulating resistive field plate structure 3 includes a field plate dielectric layer 31 and a semi-insulating resistive field plate layer 32, the trench gate structure 4 includes a gate dielectric layer 41, a first trench gate layer 42 and a second trench gate layer 43; where the second trench gate layer 43 is electrically connected with the semi-insulating resistive field plate layer 32; and the semi-insulating resistive field plate layer 32 is electrically connected with the substrate 1 at the bottom of the trench.

More specifically, as shown in FIG. 1, the MOS device with resistive field plate for realizing conductance modulation field effect further includes:
  a MOS channel contact region 23, arranged at the top part of the epitaxial layer 2, and connected with the MOS channel region 21.

More specifically, as shown in FIG. 1, the MOS device with resistive field plate for realizing conductance modulation field effect further includes:
  a source electrode 5, arranged on the MOS channel contact region 23, and electrically connected with the MOS source regions 22 on both sides of the MOS channel contact region 23;
  a drain electrode (not shown in the figure), arranged on the side of the substrate 1 away from the epitaxial layer 2;
  a gate electrode (not shown in the figure), arranged on the trench gate structure 4, electrically connected with the trench gate structure 4.

Figure 2:
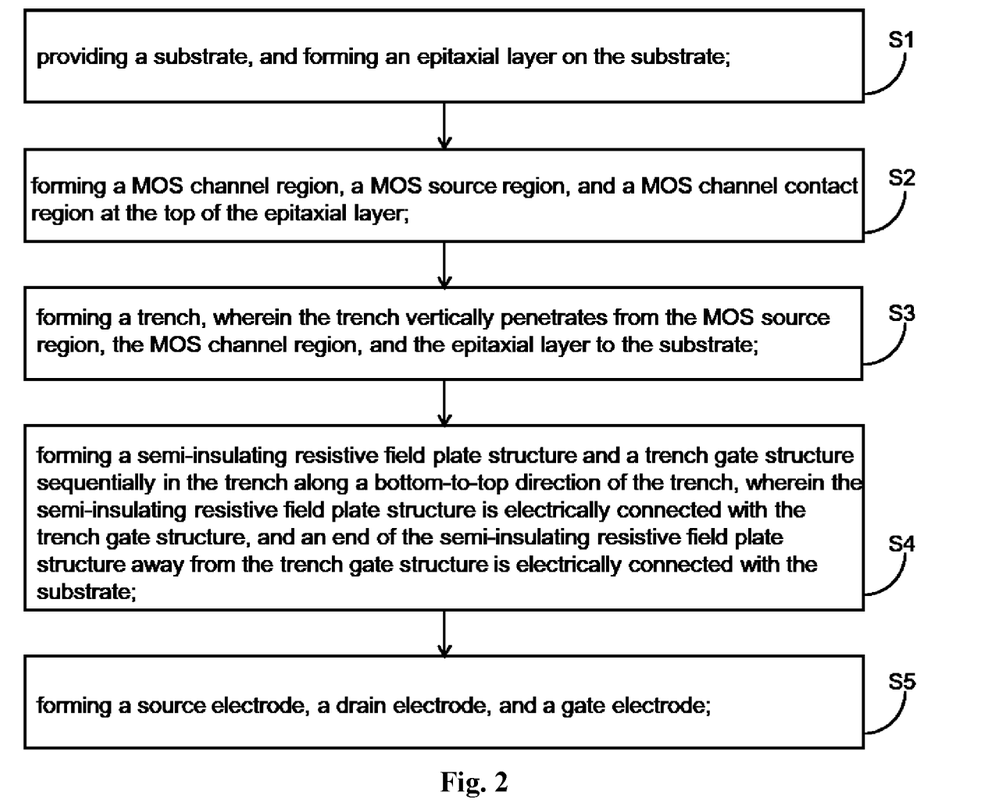
FIG. 2 shows a schematic diagram of steps in a method for preparing the MOS device with resistive field plate for realizing conductance modulation field effect according to the present invention.

As shown in FIG. 2, the present invention also provides a preparation method of the MOS device with resistive field plate for realizing conductance modulation field effect, includes:
  S1, providing a substrate 1, and forming an epitaxial layer 2 on the substrate 1;
  S2, forming a MOS channel region 21, a MOS source region 22, and a MOS channel contact region 23 at the top of the epitaxial layer 2;
  S3, forming a trench T, vertically penetrating from the MOS source region 22, the MOS channel region 21, and the epitaxial layer 2 to the substrate 1;
  S4, forming a semi-insulating resistive field plate structure 3 and a trench gate structure 4 sequentially in the trench T along the bottom to the top direction of the trench T, where the semi-insulating resistive field plate structure 3 is electrically connected with the trench gate structure 4, and an end of the semi-insulating resistive field plate structure 3 away from the trench gate structure 4 is electrically connected with the substrate 1;

S5, forming a source electrode 5, a drain electrode, and a gate electrode.

The implementation of the technical solution in the present invention is described below by taking a N-channel high-voltage MOS device as an example, and other ways that can realize the content of the present invention should not be considered as different from the present invention. The corresponding P-channel high-voltage MOS devices and the N-channel MOS devices are structurally equivalent, while doped differently. The process needs to be adjusted according to the different process characteristics of P-type and N-type doping, it is well known to those skilled in the art and it should not be considered as not bound by the present invention. The processes described in the following examples are existing mature processes, which are not described in detail herein, therefore, most skilled in the art are supposed to understand these processes.

Figure 3:
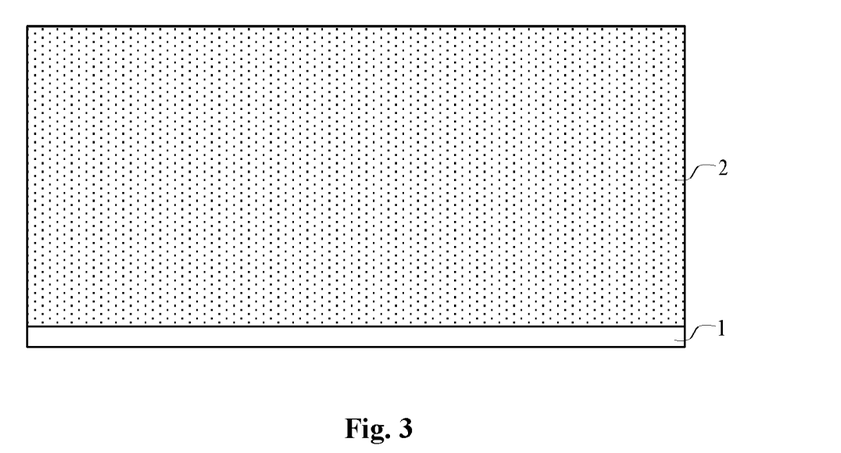
FIGS. 3-21 show process flow diagrams of the method for preparing the MOS device with resistive field plate for realizing conductance modulation field effect according to the present invention.

Specifically, as shown in FIG. 3, in step S1, providing the substrate 1 as a drain region of the MOS device, where the substrate 1 is an N-type doped semiconductor material (such as silicon, silicon carbide, gallium arsenide, etc.); and forming the epitaxial layer 2 on the substrate 1 as a drift region of the MOS device, where the epitaxial layer 2 is also an N-type doped semiconductor material.

The substrate 1 is heavily doped, and the epitaxial layer 2 is lightly doped. The thickness of the epitaxial layer 2 can be flexibly designed depending on the situation, for example, when a breakdown voltage reaches 300V, the thickness of the epitaxial wafer 2 can be designed to be 20 μm.

Specifically, between step S1 and step S2, the preparing method for the MOS device with resistive field plate for realizing conductance modulation field effect further includes: forming a photolithographic alignment mark on the epitaxial layer 2, so as to facilitate the alignment in subsequent process steps.

Figure 4:
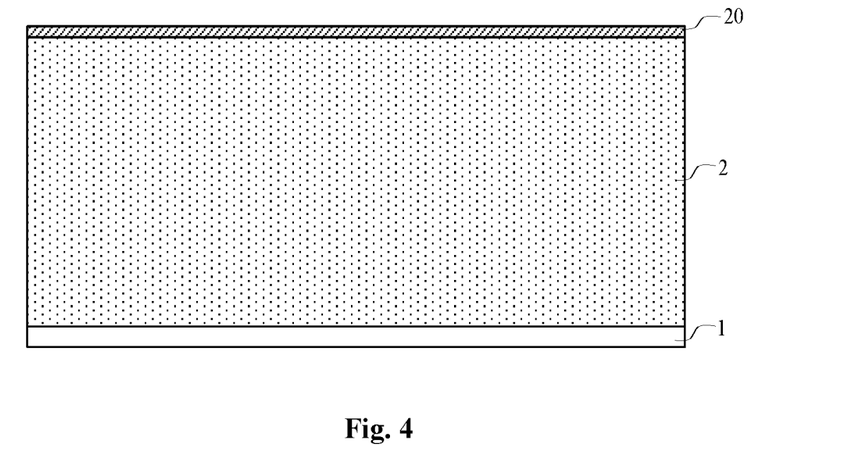

Specifically, as shown in FIG. 4, between step S1 and step S2, the preparation method of the MOS device with resistive field plate for realizing conductance modulation field effect further includes: oxidating the epitaxial layer 2 to form an oxide layer 20 at the top of the epitaxial layer 2, for example, implementing a wet oxidation under 950° C. for 20 min to obtain an oxide layer 20 with a thickness of 60 nm±10 nm.

Figure 5:
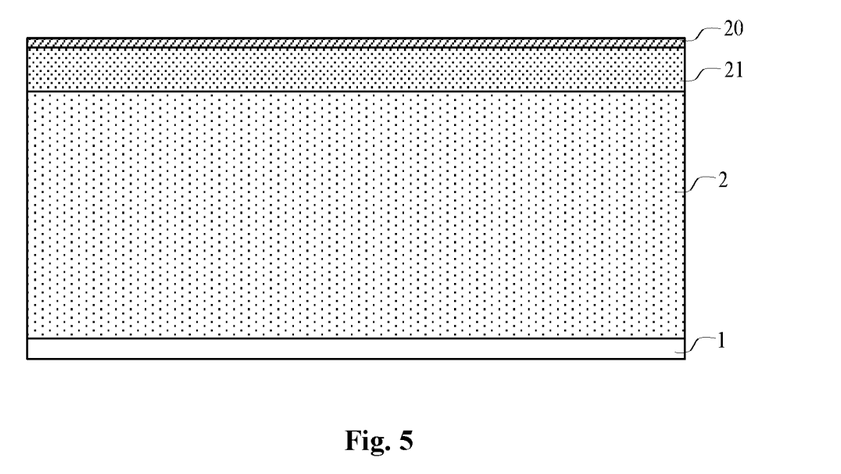
Figure 6:
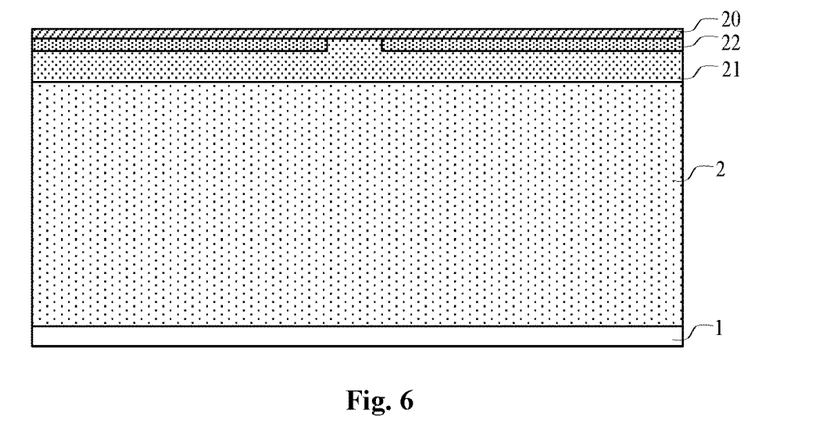
Figure 7:
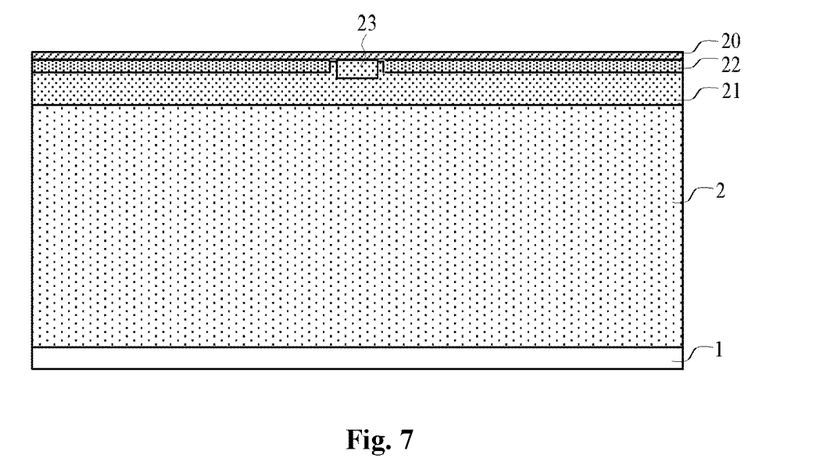

Specifically, as shown in FIGS. 5-7, the step S2 of forming the MOS channel region 21, the MOS source region 22, and the MOS channel contact region 23 at the top part of the epitaxial layer 2 further includes:

S21, as shown in FIG. 5, forming the MOS channel region 21 in the top part of the epitaxial layer 2 by a first ion implantation and a first ion diffusion;

S22, as shown in FIG. 6, forming the MOS source region 22 on the MOS channel region 21 by a second ion implantation;

S23, as shown in FIG. 7, forming the MOS channel contact region 23 connected with the MOS channel region 21 by a third ion implantation;

More specifically, as shown in FIG. 5, in step S21, implementing the first ion implantation, for example, 100 Kev, $5 \times 10^{13}$ cm$^{-2}$ boron ion implantation, and then implementing the first ion diffusion, for example, 1050° C., 90 min ion diffusion, under the protection of inert gas to form a P-type doped MOS channel region 21 in the top part of the epitaxial layer 2.

More specifically, as shown in FIG. 6, in step S22, lithographing the source region by using a photoresist as a shielding mask, and then implementing the second ion implantation, for example, 170 kev, $5 \times 10^{15}$ cm$^{-2}$ arsenic ion implantation, to form the MOS source region 22.

More specifically, as shown in FIG. 7, in step S23, lithographing the channel contact region by using a photoresist as a shielding mask, and then implementing the third ion implantation, for example, 80 kev, $3 \times 10^{15}$ cm$^{-2}$ boron ion implantation, to form the MOS channel contact region 23 connected with the MOS channel region 21.

When the doping concentration of the MOS channel region 21 is sufficient to form an electrical connection (ohmic contact), the MOS channel contact region 23 can be omitted, and details are not described herein.

Figure 8:
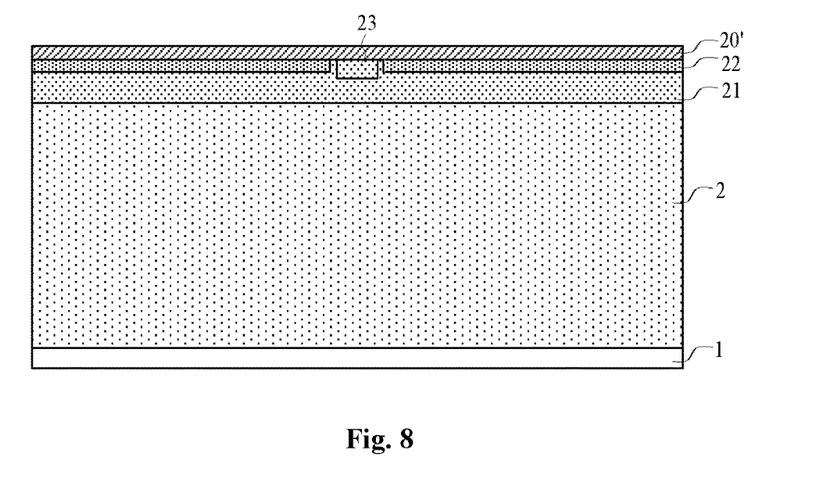

Specifically, as shown in FIG. 8, between step S2 and step S3, the preparation method of the MOS device with resistive field plate for realizing conductance modulation field effect further includes: forming another oxide layer with a thickness of 450 nm±50 nm on the oxide layer 20 by low pressure chemical vapor deposition (LPCVD) to maintain a shallow junction depth and make full use of the epitaxial layer 2, the another oxide layer increases the thickness of the oxide layer 20, and the formed two oxide layers are renamed an oxide layer 20' which is a foundation for etching a hard masking layer of the trench T.

Figure 9:
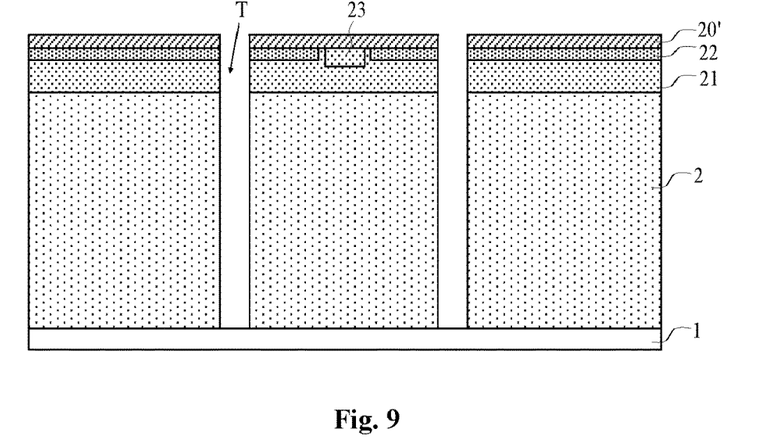

Specifically, in step S3, exposing the position of the trench T by using a lithography machine and the corresponding mask, and then forming the trench T by dry etching, where the trench T vertically penetrates from the oxide layer 20', the MOS source region 22, the MOS channel region 21, and the epitaxial layer 2 to the substrate 1, as shown in FIG. 9.

The specific parameters of the trench T (including the number, depth, and width of the trench T) need to be designed according to the working voltage of the high-voltage MOS device and the process implementation capability, meanwhile, the size of the semi-insulating resistive field plate structure 3 and the trench gate structure 4 subsequently formed in the same trench T and the optimal area required by the MOS need to be considered in the design process. In an embodiment, the depth of the trench T is 22 μm and the width of the trench T is 1.5~2 μm.

Figure 10:
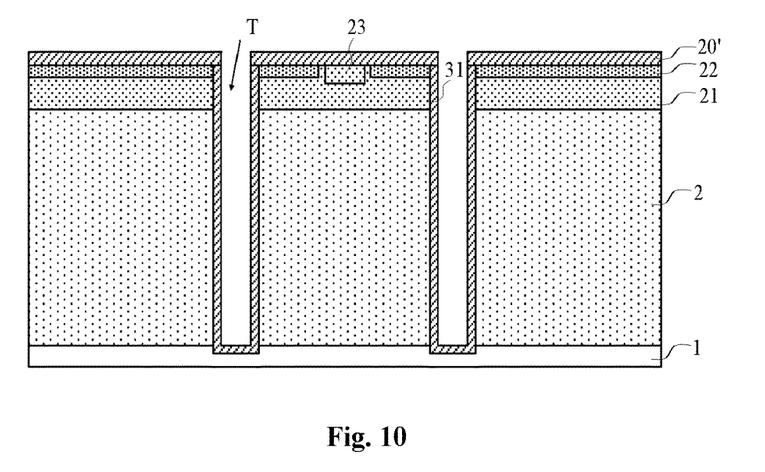
Figure 11:
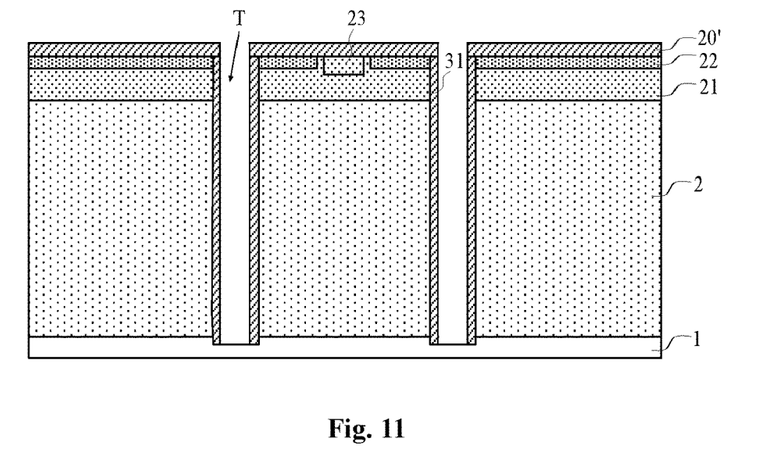
Figure 12:
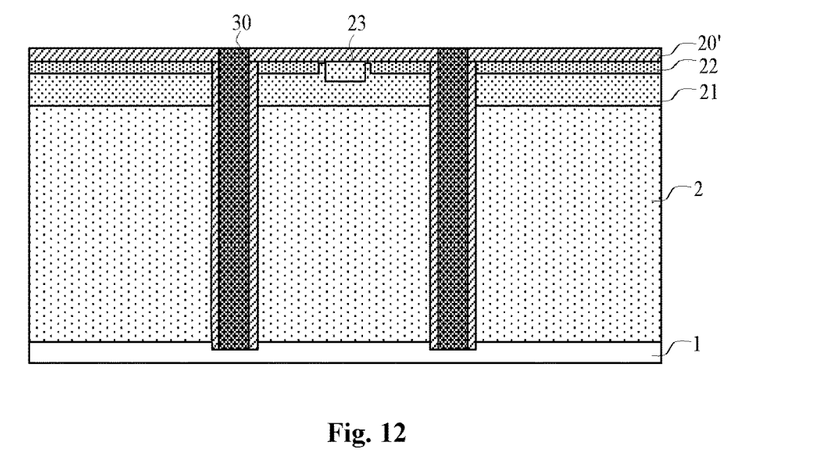
Figure 13:
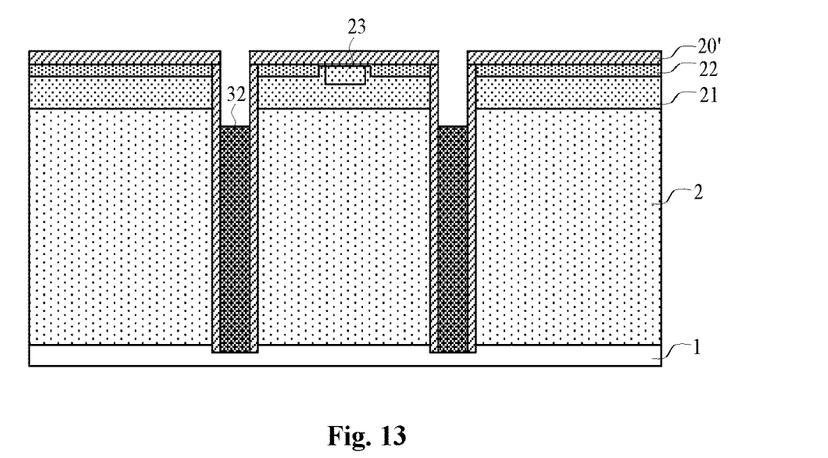

Specifically, as shown in FIGS. 10-16, step S4 that forming the semi-insulating resistive field plate structure 3 and the trench gate structure 4 sequentially in the trench T along the bottom to the top direction of the trench T further includes:

S41, as shown in FIG. 10, oxidating the bottom and side walls of the trench T to form the field plate dielectric layer 31;

S42, as shown in FIG. 11, etching and removing the field plate dielectric layer 31 at the bottom of the trench T;

S43, as shown in FIGS. 12-13, filling the trench T to form the semi-insulating resistive field layer 32, where the top part of the trench T is not completely filled, and the remaining top part of the trench T which is not filled at least passes through the MOS channel region 21;

S44, etching and removing the field plate dielectric layer 31 at the remaining top part of the trench T;

S45, oxidating the side walls and bottom of the remaining top part of the trench T to form the gate dielectric layer 41;

S46, along the trench wall of the trench T inward, forming the first trench gate layer 42 and the second trench gate layer 43 in the remaining top part of the trench T sequentially, where the bottom of the second trench gate layer 43 is electrically connected with the semi-insulating resistive field plate layer 32;

The semi-insulating resistive field plate layer 32 and the remaining field plate dielectric layer 31 (not been removed in S44) constitute the semi-insulating resistive field plate structure 3, and the first trench gate layer 42, the second trench gate layer 43, and the gate dielectric layer 41 constitute the trench gate structure 4.

Specifically, as shown in FIG. 10, in step S41, oxidating the bottom and the side walls of the substrate 1 to form the field plate dielectric layer 31, for example, a field plate dielectric layer 31 with a thickness of 200 nm±10 nm can be obtained by implementing a wet oxidation under 950° C. for 90 min.

More specifically, as shown in FIG. 11, in step S42, removing the field plate dielectric layer 31 at the bottom of the trench T through anisotropic dry etching, and retaining the field plate dielectric layer 31 at the side walls of the trench T.

More specifically, as shown in FIGS. 12-13, step S43 that forming the semi-insulating resistive field layer 32 in the trench T further includes:

S431, as shown in FIG. 12, filling the trench T with semi-insulating polysilicon material 30, for example, a deposition thickness of 1.1 μm±0.1 μm can be obtained by employing low-pressure chemical vapor deposition process;

S432, as shown in FIG. 13, etching the semi-insulating polysilicon material 30 reversely first to expose the oxide layer 20' under the semi-insulating polysilicon material 30, and then etching and removing a part of the semi-insulating polysilicon material 30 filled in the trench T to expose the top part of the trench T, where the exposed top part of the trench T at least passes through the MOS channel region 21;

The exposed top part of the trench T is the remaining part of the trench T which is not filled, and the remaining semi-insulating polysilicon material 30 in the trench T is the semi-insulating resistive field plate layer 32. When etching a part of the semi-insulating polysilicon material 30 filled in the trench T, it is necessary to control the etching depth to guarantee that the subsequently formed trench gate structure 4 can cover the MOS channel region 21 formed by double diffusion in the vertical direction and to ensure that the MOS channel region 21 can be controlled by the trench gate structure 4 for on and off.

Figure 14:
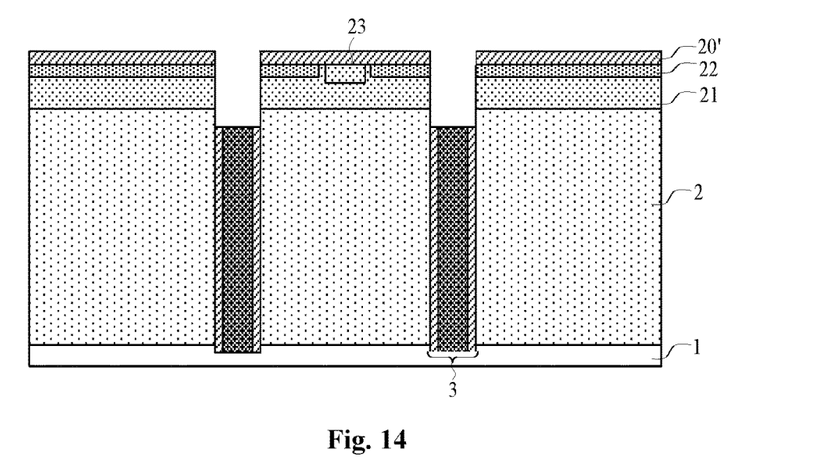

More specifically, as shown in FIG. 14, in step S44, etching and removing the field plate dielectric layer 31 located at the side walls of the remaining top part of the trench T includes, for example, etching the field plate dielectric layer 31 with a thickness of 200 nm by isotropic wet etching.

Figure 15:
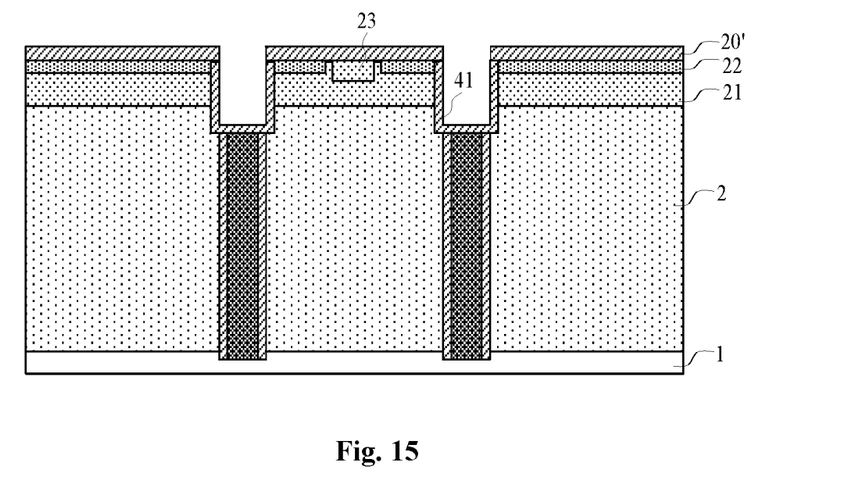

More specifically, as shown in FIG. 15, in step S45, oxidating the side walls and the bottom of the remaining top part of the trench T to form the gate dielectric layer 41, where the gate dielectric layer 41 is used as an oxidized dielectric layer of the trench structure 4, for example, an 80-100 nm high-quality gate dielectric layer 41 can be formed by dry oxidation with chlorine doping under the condition of 950° C. and 125 min.

Figure 16:
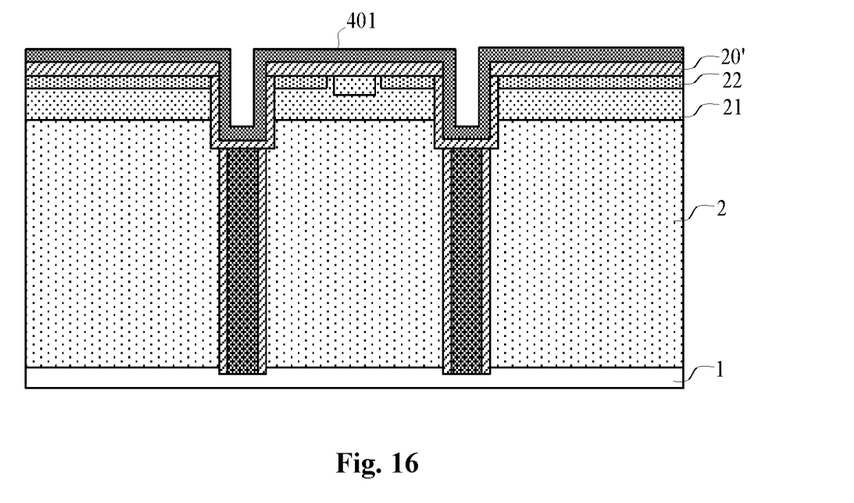
Figure 17:
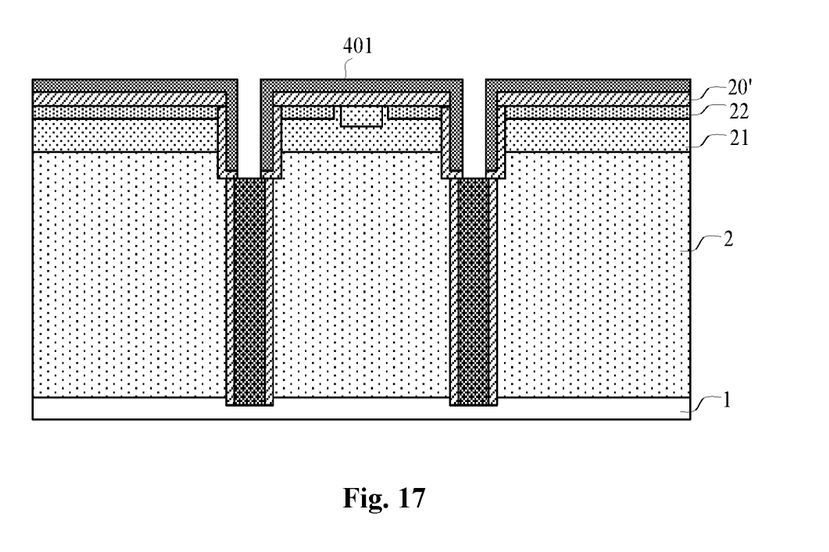
Figure 18:
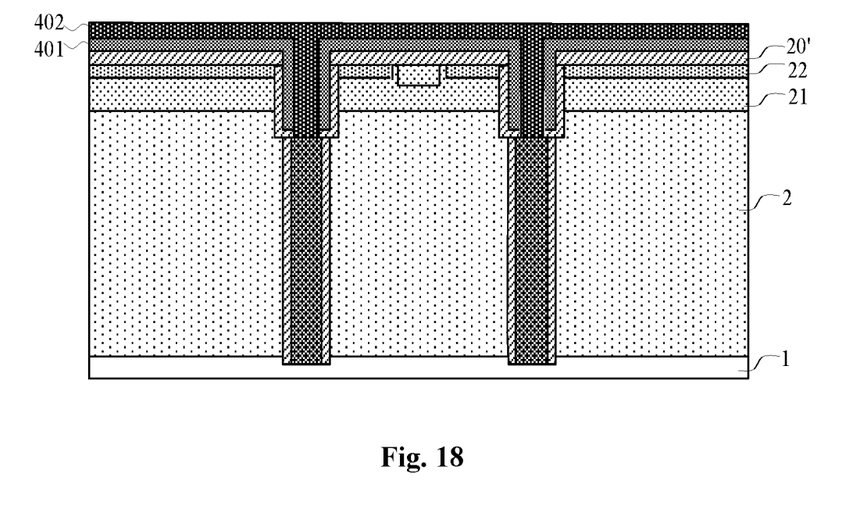
Figure 19:
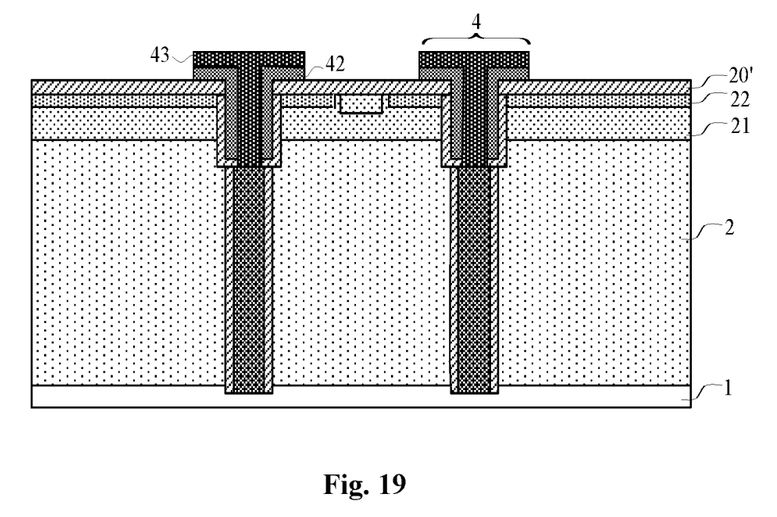

More specifically, as shown in FIGS. 16-18, step S46 that along the trench wall of the trench T inward, forming the first trench gate layer 42 and the second trench gate layer 43 in the remaining top part of the trench T sequentially further includes:

S461, as shown in FIG. 16, forming a first doped polysilicon material 401, where the first doped polysilicon material 401 at least covers the bottom and side walls of the remaining top part of the trench T;

S462, as shown in FIG. 17, etching and removing the first doped polysilicon material 401 and gate dielectric layer 41 at the bottom of the remaining top part of the trench T to expose the top of the semi-insulating resistive field plate layer 32;

S463, as shown in FIG. 18, forming a second doped polysilicon material 402 on the first doped polysilicon material 401, where the second doped polysilicon material 402 at least fills the remaining top part of the trench T;

S464, as shown in FIG. 19, etching a part of the second doped polysilicon material 402 and a part of the first doped polysilicon material 401 on the oxide layer 20' to form the second trench gate layer 43 and the first trench gate layer 42, respectively.

Further, as shown in FIG. 16, in step S461, forming the first doped polysilicon material 401 by deposition, where the first doped polysilicon material 401 is at least distributed on the bottom and the side walls of the remaining top part of the trench T, for example, the first doped polysilicon material 401 with a thickness of 450-600 nm can be formed by low-pressure chemical vapor in-situ phosphorus doping deposition or by phosphate diffusion doping after depositing the polysilicon material if there is no in-situ doping equipment.

Further, as shown in FIG. 17, in step S462, etching and removing the first doped polysilicon material 401 and gate dielectric layer 41 at the bottom of the remaining top part of the trench T to expose the top of the semi-insulating resistive field plate layer 32; and then removing the first doped polysilicon material 401 and the gate dielectric layer 41 at the bottom of the remaining top part of the trench T by anisotropic dry etching, where gate dielectric layer 41 is under the first doped polysilicon material 401.

Further, as shown in FIG. 18, in step S463, forming the second doped polysilicon material 402 on the first doped polysilicon material 401, where the second doped polysilicon material 402 at least fills the remaining top part of the trench T, for example, the second doped polysilicon material 402 with a thickness of 500-650 nm can be formed by low-pressure chemical vapor in-situ phosphorus doping deposition, and if there is no in-situ doping equipment, the remaining top part of the trench T can be enclosed and phosphorus ion can be implanted under the condition of 100 KeV, $5 \times 10^{15}$ cm$^{-2}$.

Further, as shown in FIG. 19, in step S464, etching the second doped polysilicon material 402 and the first doped polysilicon material 401 by photolithography and dry etching to form the pattern of the trench gate structure 4 and obtain the second trench gate layer 43 and the first trench gate layer 42, where the second doped polysilicon material 402 and the first doped polysilicon material 401 are formed by deposition.

Etching the second doped polysilicon material 402 to form the second trench gate layer 43, etching the first doped polysilicon material 401 to form the first trench gate layer 42, and the bottom of the second trench gate layer 43 is electrically connected with the semi-insulating resistive field plate layer 32.

Specifically, in step S5, forming an isolation dielectric layer 50 on the oxide layer 20' and the trench gate structure 4 first by deposition; forming a source contact hole and a gate contact hole in the isolation dielectric layer secondly; depositing a metal layer and photoetching the metal layer to form a source electrode and a gate electrode thirdly; and then depositing a metal layer on the side of the substrate 1 away from the epitaxial layer 2 to form a drain electrode.

Figure 20:
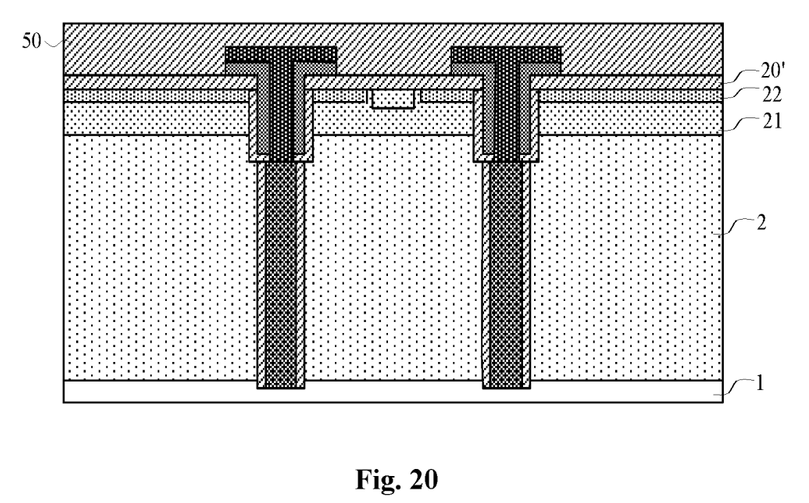
Figure 21:
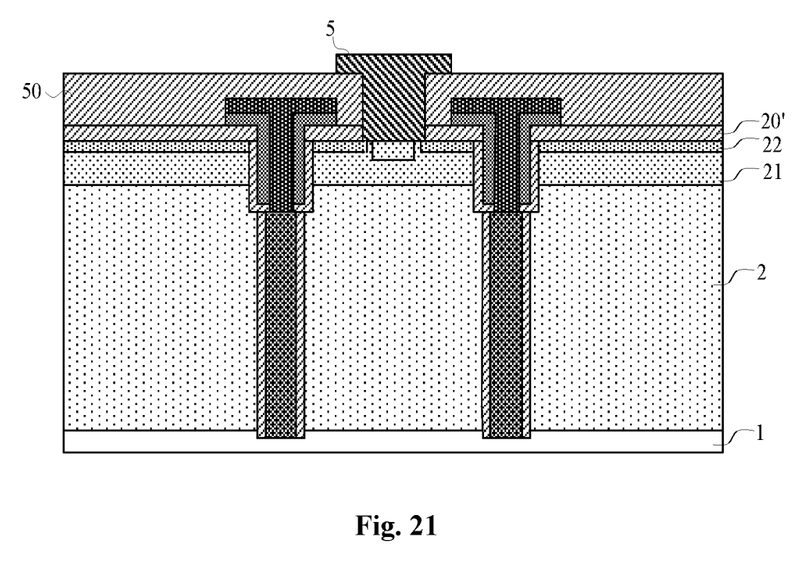

More specifically, as shown in FIGS. 20-21, forming an isolation dielectric layer on the oxide layer 20' and the trench gate structure 4 first by deposition; forming a source contact hole in the isolation dielectric layer secondly; and then depositing a metal layer and photoetching the metal layer to form a source electrode 5. It is understood that the process of forming the gate electrode is similar to that of the source electrode, therefore, a related description will not be repeated herein.

Finally, the MOS device with resistive field plate for realizing conductance modulation field effect as shown in FIG. 21 is obtained. The MOS device with resistive field plate for realizing conductance modulation field effect is based on the existing trench gate MOS device, and a semi-insulating resistive field plate electrically connected to the trench gate structure and the drain structure is added in the drift region, where the trench gate structure can control the on-off of the MOS channel, and the semi-insulating resistive field plate can modulate the conductance of the on-state drift region and the distribution of off-state high-voltage blocking electric field, thus a lower on-resistance can be obtained. Numerical calculations show that under the same process and design parameters, the current output capability of the MOS device with resistive field plate for realizing conductance modulation field effect of the present invention increases by 70% to 105% compared with that of the first-generation PN junction type super junction device, in addition, the modern 2.5-dimensional processing technology based on deep trench etching is adopted in the present invention, which is conducive to the miniaturization design and high density design of the structure.

Furthermore, it should be noted that the well-known and obvious industry general cleaning and other simple processes and conditions are omitted in the steps of the above embodiments, which are known to those skilled in the art and will not be described in detail herein. After adaptable modifications, the MOS device with resistive field plate for realizing conductance modulation field effect of the present invention can also be applied to the design of voltage withstanding drift regions, such as diodes, Schottky diodes, and collector regions of triodes, under the condition of minority carrier implantation.

All in all, the MOS device with resistive field plate for realizing conductance modulation field effect and the preparation method thereof in the present invention is based on the existing trench gate MOS device, and a semi-insulating resistive field plate electrically connected to the trench gate structure and the drain structure is added in the drift region, where the trench gate structure can control the on-off of the MOS channel, and the semi-insulating resistive field plate can adjust the doping concentration of the drift region to modulate the conductance of the on-state drift region and the distribution of off-state high-voltage blocking electric field, thus a lower on-resistance can be obtained. In addition, the modern 2.5-dimensional processing technology based on deep trench etching is adopted in the present invention, which is conducive to the miniaturization design and high density design of the structure and is more suitable for the More than Moore (beyond Moore) development of modern integrated semiconductor devices.

The above-mentioned embodiments are merely illustrative of the principle and effects of the present disclosure instead of limiting the present disclosure. Modifications or variations of the above-described embodiments may be made by those skilled in the art without departing from the spirit and scope of the disclosure. Therefore, all equivalent modifications or changes made by those who have common knowledge in the art without departing from the spirit and technical concept disclosed by the present disclosure shall be still covered by the claims of the present disclosure.

What is claimed is:

1. A MOS device with resistive field plate for realizing conductance modulation field effect, comprising:
    a substrate, configured as a drain region of the MOS device;
    an epitaxial layer, arranged on the substrate;
    at least two MOS source regions, arranged in the epitaxial layer and at the top of the epitaxial layer;
    a MOS channel region, arranged in the epitaxial layer and under the MOS source regions;
    at least two trench gate structures, arranged on the top of the epitaxial layer, wherein the trench gate structures vertically cover the MOS source regions and the MOS channel region; and
    at least two semi-insulating resistive field plate structures, arranged in the epitaxial layer and electrically connected with the substrate, and each located under a respective one of the trench gate structures and electrically connected with the respective trench gate structure; and
    a MOS channel contact region, arranged at the top part of the epitaxial layer, between two of the MOS source regions and between two of the trench gate structures, and connected with the MOS channel region;
    wherein at least two trenches are formed in the epitaxial layer, and the trenches vertically penetrate from the MOS source regions, the MOS channel region, and the epitaxial layer to the substrate; and one of the semi-insulating resistive field plate structures and one of the trench gate structures are sequentially arranged in and fill each of the trenches along a bottom-to-top direction of the respective trench;
    along a sidewall of each of the trenches inward, the respective semi-insulating resistive field plate structure comprises a field plate dielectric layer and a semi-insulating resistive field plate layer; along the sidewall of each of the trenches inward, the respective trench gate structure comprises a gate dielectric layer, a first trench gate layer and a second trench gate layer; wherein the second trench gate layer is electrically connected and in direct contact with the respective semi-insulating resistive field plate layer; and the respective semi-insulating resistive field plate layer is electrically connected and in direct contact with the substrate at the bottom of the trench.

2. The MOS device with resistive field plate for realizing conductance modulation field effect according to claim 1, further comprising:
    a source electrode, arranged on the MOS channel contact region, and electrically connected with two of the MOS source regions respectively located on two opposite sides of the MOS channel contact region;
    a drain electrode, arranged on a side of the substrate away from the epitaxial layer; and
    a gate electrode, arranged on the trench gate structure and electrically connected with the trench gate structure.

3. The MOS device with resistive field plate for realizing conductance modulation field effect according to claim 1, wherein the semi-insulating resistive field plate layer comprises a semi-insulating polysilicon material.

4. The MOS device with resistive field plate for realizing conductance modulation field effect according to claim 1, wherein the trench gate structure is configured to control the on-off of the MOS channel region.

5. The MOS device with resistive field plate for realizing conductance modulation field effect according to claim 1, wherein the substrate is made of an N-type doped semiconductor material, wherein the epitaxial layer is configured as a drift region of the MOS device, and the epitaxial layer is made of an N-type doped semiconductor material, wherein the substrate is heavily doped, and the epitaxial layer is lightly doped.

* * * * *